United States Patent
Lee et al.

(10) Patent No.: US 8,564,139 B2
(45) Date of Patent: Oct. 22, 2013

(54) SEMICONDUCTOR DEVICES INCLUDING PROTECTED BARRIER LAYERS

(75) Inventors: Ho-Jin Lee, Seoul (KR); Pil-Kyu Kang, Anyang-si (KR); Seokho Kim, Bucheon-si (KR); Byung Lyul Park, Seoul (KR); Kyu-Ha Lee, Yongin-si (KR); Hyunsoo Chung, Hwaseong-si (KR); Gilheyun Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/610,068

(22) Filed: Sep. 11, 2012

(65) Prior Publication Data

US 2013/0134603 A1    May 30, 2013

(30) Foreign Application Priority Data

Nov. 24, 2011  (KR) .......................... 10-2011-0123532

(51) Int. Cl.
*H01L 23/48*  (2006.01)

(52) U.S. Cl.
USPC ........... 257/774; 257/621; 257/773; 257/775; 257/E23.01; 257/E23.011; 257/E23.023

(58) Field of Classification Search
USPC ............ 257/621, 773–775, E23.01, E23.011, 257/E23.022, E23.023
See application file for complete search history.

(56) References Cited

U.S. PATENT DOCUMENTS

| | | | |
|---|---|---|---|
| 5,877,082 A * | 3/1999 | Kimizuka et al. | ............ 438/625 |
| 6,690,093 B2 * | 2/2004 | Ahn et al. | ...................... 257/774 |
| 6,815,337 B1 * | 11/2004 | Hsiao | .............................. 438/628 |
| 7,572,673 B2 | 8/2009 | Chung et al. | |
| 7,838,992 B2 | 11/2010 | Chung et al. | |
| 7,928,534 B2 | 4/2011 | Hsu et al. | |
| 2008/0265424 A1 * | 10/2008 | Noma et al. | ................... 257/762 |
| 2010/0164109 A1 | 7/2010 | Chiou et al. | |
| 2010/0276787 A1 | 11/2010 | Yu et al. | |
| 2011/0031621 A1 | 2/2011 | Chung et al. | |

FOREIGN PATENT DOCUMENTS

KR    1020070073184 A    7/2007

* cited by examiner

*Primary Examiner* — Peniel M Gumedzoe
(74) *Attorney, Agent, or Firm* — Myers Bigel Sibley & Sajovec, P.A.

(57) ABSTRACT

Provided are semiconductor devices and methods of manufacturing the same. the device may include a semiconductor substrate, a first conductive pattern provided in the semiconductor substrate to have a first width at a surface level of the semiconductor substrate, a barrier pattern covering the first conductive pattern and having a second width substantially greater than the first width, a second conductive pattern partially covering the barrier pattern and having a third width substantially smaller than the second width, and an insulating pattern disposed on a sidewall of the second conductive pattern. The second width may be substantially equal to or less than to a sum of the third width and a width of the insulating pattern.

18 Claims, 14 Drawing Sheets

SEMICONDUCTOR DEVICES INCLUDING PROTECTED BARRIER LAYERS

CROSS-REFERENCE TO RELATED APPLICATION

This U.S. non-provisional patent application claims priority under 35 U.S.C. §119 to Korean Patent Application No. 10-2011-0123532, filed on Nov. 24, 2011, in the Korean Intellectual Property Office, the entire contents of which are hereby incorporated by reference.

BACKGROUND

Embodiments of the inventive concepts relate to semiconductors devices, and more particularly, to semiconductor packages and methods of manufacturing the same.

In order to meet the demands of small-sized electronic devices, pads or redistributed interconnection lines can be used to connect a plurality of chips in the semiconductor package electrically with each other. In addition, there has been suggested a multi-stack semiconductor package, in which "through silicon vias" are used to connect the semiconductor chips with each other.

SUMMARY

A semiconductor device may include a semiconductor substrate, a first conductive pattern provided in the semiconductor substrate to have a first width at a surface level of the semiconductor substrate, a barrier pattern covering the first conductive pattern and having a second width substantially greater than the first width, a second conductive pattern partially covering the barrier pattern and having a third width substantially smaller than the second width, and an insulating pattern disposed on a sidewall of the second conductive pattern. The second width may be substantially equal to or less than a sum of the third width and a width of the insulating pattern.

In example embodiments, the insulating pattern may be in contact with the barrier pattern and cover at least partially the sidewall of the second conductive pattern.

In example embodiments, the insulating pattern may have a width increasing toward the barrier pattern.

In example embodiments, the insulating pattern may extend from the sidewall of the second conductive pattern to cover at least partially a top surface of the second conductive pattern.

In example embodiments, a portion of the insulating pattern disposed on the sidewall of the second conductive pattern may have a width increasing toward the barrier pattern.

In example embodiments, a portion of the insulating pattern disposed on the sidewall of the second conductive pattern may have the substantially same width as that on the top surface of the second conductive pattern.

In example embodiments, the insulating pattern may have a portion protruding outward from an outer sidewall of the barrier pattern.

In example embodiments, the device may further include a passivation layer disposed on the second conductive pattern, the insulating pattern, and the semiconductor substrate to expose partially the second conductive pattern, and a third conductive pattern electrically connected to the second conductive pattern.

According to example embodiments of inventive concepts, a method of manufacturing a semiconductor device may include forming a first conductive pattern through a semiconductor substrate, forming a barrier layer on the semiconductor substrate to cover the first conductive pattern, forming a second conductive pattern aligned with the first conductive pattern on the barrier layer, forming an insulating pattern on a sidewall of the second conductive pattern, and forming a barrier pattern by etching the barrier layer using the second conductive pattern and the insulating pattern as an etch mask.

In example embodiments, the forming of the insulating pattern may include forming an insulating layer on the barrier layer and the second conductive pattern and etching the insulating layer in a blanket etch back manner to form the insulating pattern.

In example embodiments, the etching of the insulating layer in the blanket etch back manner may be performed until exposing the barrier layer.

In example embodiments, the etching of the insulating layer in a blanket etch back manner may be performed to remain a portion of the insulating layer on a top surface of the second conductive pattern.

In example embodiments, the forming of the insulating pattern and the forming of the barrier pattern may be performed in an in-situ manner.

In example embodiments, the forming of the insulating pattern may include forming an insulating layer on the barrier layer and the second conductive pattern, forming a mask on the insulating layer, and etching the insulating layer using the mask as an etching mask to form the insulating pattern.

In example embodiments, the method may further include forming a passivation layer disposed on the barrier pattern, the second conductive pattern, and the semiconductor substrate to expose partially the second conductive pattern, and forming a third conductive pattern electrically connected to the second conductive pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DESCRIPTION OF EMBODIMENTS ACCORDING TO THE INVENTIVE CONCEPT

Figure 1A:
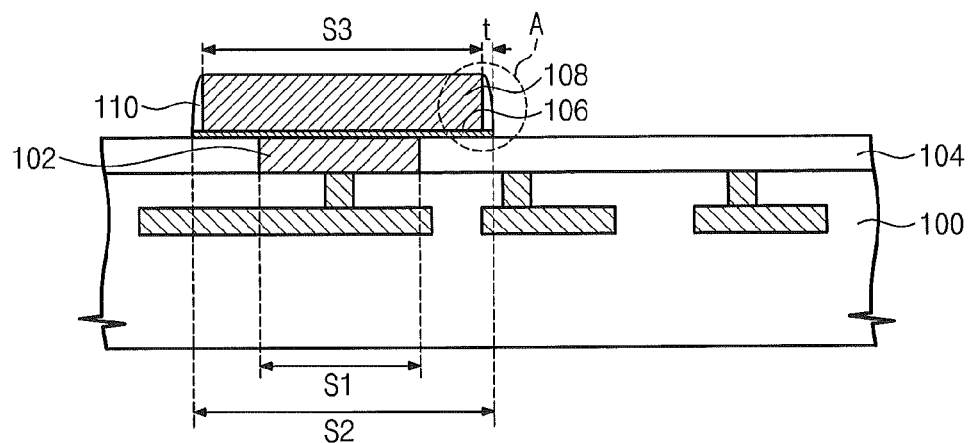
FIGS. 1A through 1E are sectional views illustrating semiconductor devices according to example embodiments of inventive concepts.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A through 1E are sectional views illustrating semiconductor devices according to example embodiments of inventive concepts.

Referring to FIGS. 1A through 1E, a semiconductor device may include a semiconductor substrate 100, a first conductive pattern 102, a barrier pattern 106, a second conductive pattern 108, and an insulating pattern 110.

The semiconductor substrate 100 may include one of a silicon substrate, a germanium substrate or a silicon-germanium substrate. The semiconductor substrate 100 may include top and bottom surfaces facing away from each other.

An insulating layer 104 may be provided on the top surface of the semiconductor substrate 100. The insulating layer 104 may include at least one layer of oxide, nitride, oxynitride, or any combination thereof.

The first conductive pattern 102 may be provided to fill a gap region, which may be formed in the semiconductor substrate 100 and/or the insulating layer 104. In example embodiments, a top surface of the first conductive pattern 102 may be substantially coplanar with a top surface of the insulating layer 104, and thus be in contact with the barrier pattern 106.

The first conductive pattern 102 may have a first width S1 in a certain direction. In example embodiments, the first width S1 may be a parameter determining an occupying area of the first conductive pattern 102, in plan or vertical sectional view. For example, in the case in which the first conductive pattern 102 has a rectangular top surface, the first width S1 may be a length of a side of the top surface of the first conductive pattern 102.

The first conductive pattern 102 may include at least one of copper, tungsten, gold, silver, platinum, nickel, or any mixture or alloy thereof.

The barrier pattern 106 may be provided on the top surface of the semiconductor substrate 100 to cover the entire top surface of the first conductive pattern 102. A portion of the barrier pattern 106, which is in contact with the first conductive pattern 102, may have a second width S2 substantially greater than the first width S1. The second width S2 may be a parameter determining an occupying area of the barrier pattern 106, in plan or vertical sectional view. For example, in the case in which the barrier pattern 106 has a rectangular top surface, the second size S2 may be a length of a side of the top surface of the barrier pattern 106.

The barrier pattern 106 may include at least one of tantalum, tantalum nitride, titanium, titanium nitride, copper, nickel, silver, or any mixture or alloy thereof.

The second conductive pattern 108 may be provided to be in contact with the barrier pattern 106. A portion of the second conductive pattern 108, which is in contact with the barrier pattern 106, may have a third width S3 substantially smaller than the second width S2. The third width S3 may be a parameter determining an occupying area of the second conductive pattern 108, in plan or vertical sectional view. For example, in the case in which the second conductive pattern 108 has a rectangular top surface, the third width S3 may be a length of a side of the top surface of the second conductive pattern 108.

The second conductive pattern 108 may include at least one of copper, tungsten, gold, silver, platinum, nickel, or any mixture or alloy thereof.

In the case in which the semiconductor device is included in a semiconductor package, the first conductive pattern 102 may be a portion of electronic circuits integrated on the semiconductor substrate 100, and the second conductive pattern 108 may be a pad or a redistribution pattern to be connected to an external device or semiconductor chip.

The insulating pattern 110 may be provided on the barrier pattern 106 to cover at least a portion of both sidewalls of the second conductive pattern 108. The structure of the insulating pattern 110 may be variously modified, as will be described below.

As described above, the barrier pattern 106 may be formed to have the second width S2, which may be greater than the third width S3 of the second conductive pattern 108 by a total width (i.e., 2t) of a pair of the insulating patterns 110. For example, the barrier pattern 106 may have an occupying area greater than the second conductive pattern 108. This may prevent a void from being formed between the second conductive pattern 108 and the barrier pattern 106. As a result, it is possible to improve electric reliability of the semiconductor device.

According to FIG. 1A, the barrier pattern 106 can be located between the second conductive pattern 108 and the substrate 100. The barrier pattern 106 can extend beyond the opposing side walls of the second conductive pattern 108 to provide extended barrier pattern portions. The insulating pattern (or spacer) 110 on the opposing side walls of the second conductive pattern 108, can also cover at least the tops surfaces of the extended barrier pattern portions. Still further, the first conductive pattern 102 (having the width S1) can have opposing side walls that are recessed relative to the opposing side walls of the second conductive pattern 108 and the opposing side walls of the barrier pattern 106.

The insulating pattern 110 may include a material having an etch selectivity with respect to the second conductive pattern 108 and the barrier pattern 106, under an etching condition, in which a specific etchant (etching solution or etching gas) is used. According to some aspects of the inventive concepts, in the case in which the second conductive pattern 108 and the barrier pattern 106 contain metallic materials, the insulating pattern 110 may be formed to include at least one layer of oxide, nitride, or oxynitride.

Diverse structures of the insulating pattern 110 will be described below, but example embodiments of the inventive concepts may not be limited thereto.

Referring to FIG. 1A, the insulating pattern 110 may be provided on both sidewalls of the second conductive pattern 108 to have a spacer-like shape. For example, the insulating pattern 110 may be formed to have a width t increasing toward the barrier pattern 106. In addition, the insulating pattern 110 may be formed to fully cover both sidewalls of the second conductive pattern 108.

Figure 1B:
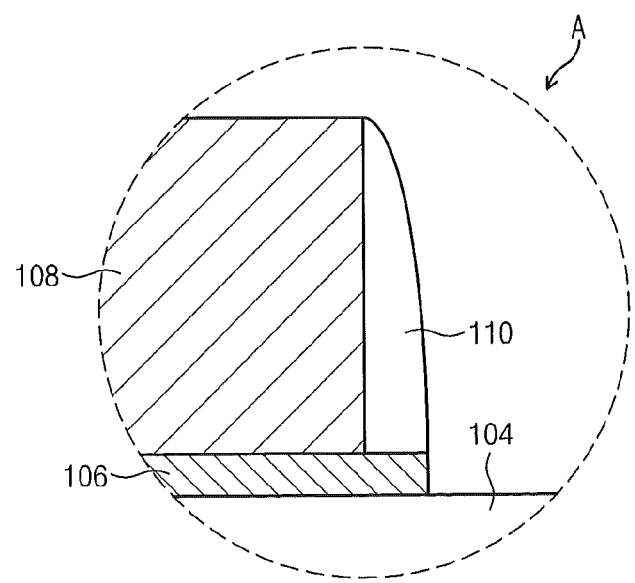
Figure 1C:
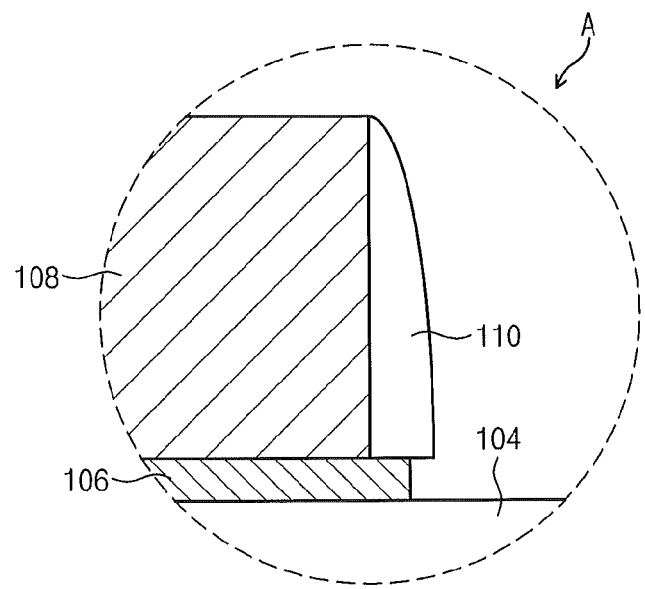

FIGS. 1B and 1C are enlarged sectional views illustrating a portion A of FIG. 1A. Referring to FIG. 1B, the insulating pattern 110 may be provided to fully cover a top surface of the barrier pattern 106 exposed by the second conductive pattern 108. For example, a sidewall of the barrier pattern 106 may be aligned with an outer sidewall of the insulating pattern 110, in plan view.

Referring to FIG. 1C, the insulating pattern 110 may include a portion laterally protruding past the barrier pattern 106 to cantilever over the insulating layer 104. For example, the outermost sidewall of the insulating pattern 110 may be located outside a sidewall of the barrier pattern 106 relative to the side wall of the second conductive layer 108. In example embodiments, in sectional view, the second width S2 of the barrier pattern 106 may range from the third width S3 of the second conductive pattern 108 to the sum of widths of the second conductive pattern 108 and a pair of the insulating patterns 110 (i.e., S3+2t).

Figure 1D:
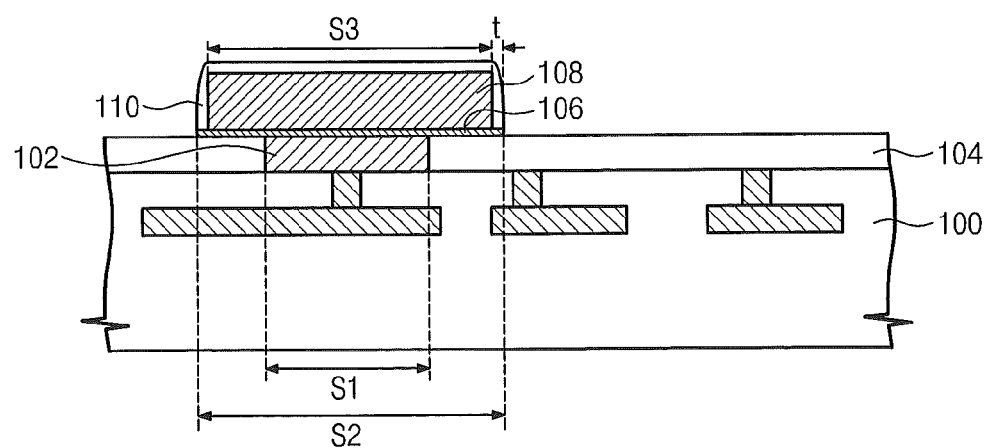

Referring to FIG. 1D, the insulating pattern 110 may cover both sidewalls of the second conductive pattern 108 and extend therefrom to cover the top surface of the second conductive pattern 108, similar to that of FIG. 1A.

Figure 1E:
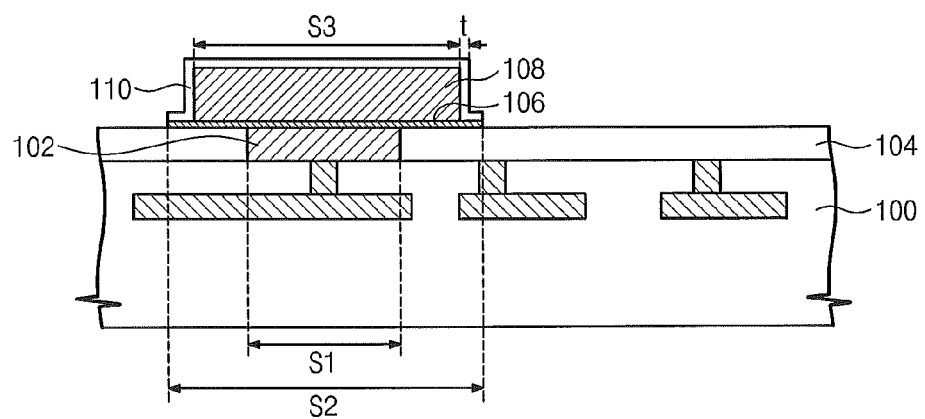

Referring to FIG. 1E, the insulating pattern 110 may cover both sidewalls of the second conductive pattern 108 and extend therefrom to cover the top surface of the second conductive pattern 108. The insulating pattern 110 of FIG. 1E, unlike that of FIG. 1D, may include a sidewall portion, whose section is shaped like a letter "L" and whose thickness is substantially uniform.

FIGS. 2A through 2D are sectional views illustrating semiconductor devices according to other example embodiments of inventive concepts.

Referring to FIGS. 2A through 2D, a semiconductor device may include a semiconductor substrate 200, a first conductive pattern 204, a barrier pattern 214, a second conductive pattern 208, an insulating pattern 212, a passivation layer 216, and a third conductive pattern 220.

The semiconductor substrate 200 may include top and bottom surfaces facing away each other. In example embodiments, several electric or electronic components, such as a transistor TR and a metal interconnection line ML, may be integrated on the back surface of the semiconductor substrate 200, and an insulating layer 202 may be formed on the top surface of the semiconductor substrate 200.

The first conductive pattern 204 may be provided through the semiconductor substrate 200 and the insulating layer 202. According to some aspects of the inventive concepts, a top surface of the first conductive pattern 204 may be substantially coplanar with a top surface of the insulating layer 202, and thus be in contact with the barrier pattern 214. The first conductive pattern 204 may have a first width S1, which may be a parameter determining an occupying area thereof in plan or vertical sectional view. In example embodiments, the first conductive pattern 204 may serve as a "through silicon via."

The barrier pattern 214 may be provided to cover the whole top surface of the first conductive pattern 204. A portion of the barrier pattern 214, which is in contact with the first conductive pattern 204, may have a second width S2 substantially greater than the first width S1.

The second conductive pattern 208 may be provided to be in contact with the barrier patter 214. A portion of the second conductive pattern 208, which is in contact with the barrier pattern 214, may have a third width S3 substantially smaller than the second width S2. In example embodiments, the second conductive pattern 208 may serve as a redistribution pattern.

The insulating pattern 212 may be provided on the barrier pattern 214 to cover at least a portion of both sidewalls of the second conductive pattern 208. The structure of the insulating pattern 212 may be variously modified, as will be described below.

As described above, the barrier pattern 214 may be formed to have the second width S2, which may be greater than the third width S3 of the second conductive pattern 208 by a total width (i.e., 2t) of a pair of the insulating patterns 212. For example, the barrier pattern 214 may have an occupying area greater than the second conductive pattern 208, and this may prevent a void from being formed between the second conductive pattern 208 and the barrier pattern 214. As a result, it is possible to improve electric reliability of the semiconductor device.

According to example embodiments of the inventive concepts, it is possible to prevent an undercut region from being formed at both edges of the barrier pattern 214, and this enables to reduce a width of the second conductive pattern 208. For example, in the conventional methods, a width of the second conductive pattern 208 should be designed in consideration of void regions formed at both sidewalls of the barrier pattern 214. According to example embodiments of inventive concepts, the undercut regions can be prevented from being formed as described above, and thus, it is possible to reduce a width of the second conductive pattern 208.

The passivation layer 216 may be provided to cover the insulating layer 202, the insulating pattern 212, and the barrier pattern 214. The passivation layer 216 may have an opening partially exposing a top surface of the second conductive pattern 208. In example embodiments, the insulating pattern 212 may also extend to partially cover the top surface of the second conductive pattern 208. For example, the insulating pattern 212 may be removed below the opening of the passivation layer 216 to partially expose the top surface of the second conductive pattern 208.

Figure 2A:
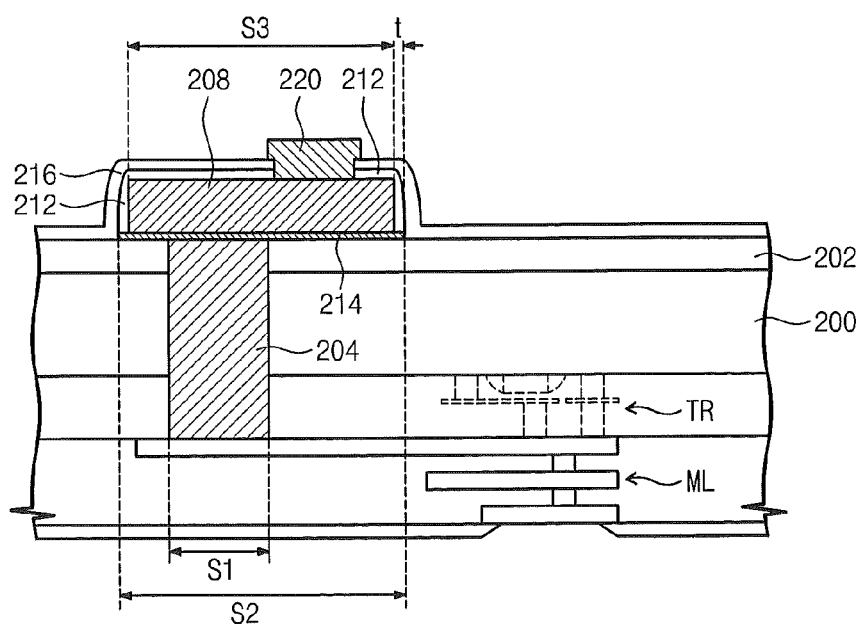
FIGS. 2A through 2D are sectional views illustrating semiconductor devices according to other example embodiments of inventive concepts.

In example embodiments of FIG. 2A, the passivation layer 216 may cover the insulating pattern 212 and extend to cover fully the insulating layer 202 provided on the substrate 200. By contrast, in example embodiments of FIG. 2B, the passivation layer 216 may cover the insulating pattern 212 and extend to partially cover the insulating layer 202 provided on the substrate 200.

The passivation layer 216 may include an insulating material, such as polyimide.

The third conductive pattern 220 may be electrically connected to the second conductive pattern 208. In example embodiments, the third conductive pattern 220 may be electrically connected to the second conductive pattern 208 through the opening delimited by the insulating pattern 212 and/or the passivation layer 216.

The third conductive pattern 220 may include at least one of copper, tungsten, gold, silver, platinum, nickel, or any mixture or alloy thereof.

Diverse structures of the insulating pattern 212 will be described below, but example embodiments of the inventive concepts may not be limited thereto.

Figure 2B:
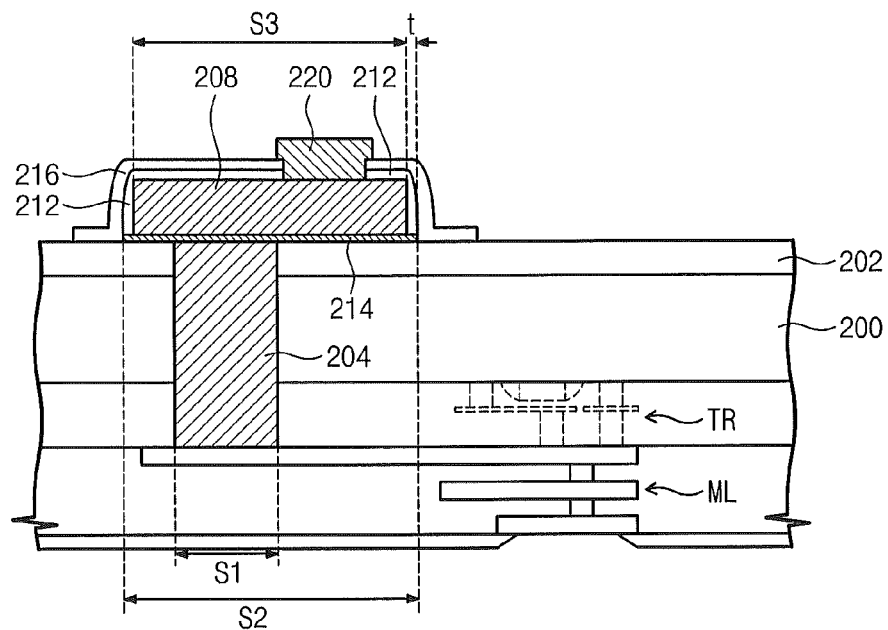

Referring to FIGS. 2A and 2B, the insulating pattern 212 may be interposed between the second conductive pattern 208 and the passivation layer 216. For example, the insulating pattern 212 may be provided to cover both sidewalls of the second conductive pattern 208 as well as to partially cover the top surface of the second conductive pattern 208. In example embodiments, a portion of the insulating pattern 212 disposed on the sidewalls of the second conductive pattern 208 may be formed to have a width increasing toward the barrier pattern 214. Other portion of the insulating pattern 212 disposed on the second conductive pattern 208 may be formed to expose the top surface of the second conductive pattern 208 below the opening of the passivation layer 216.

Figure 2C:
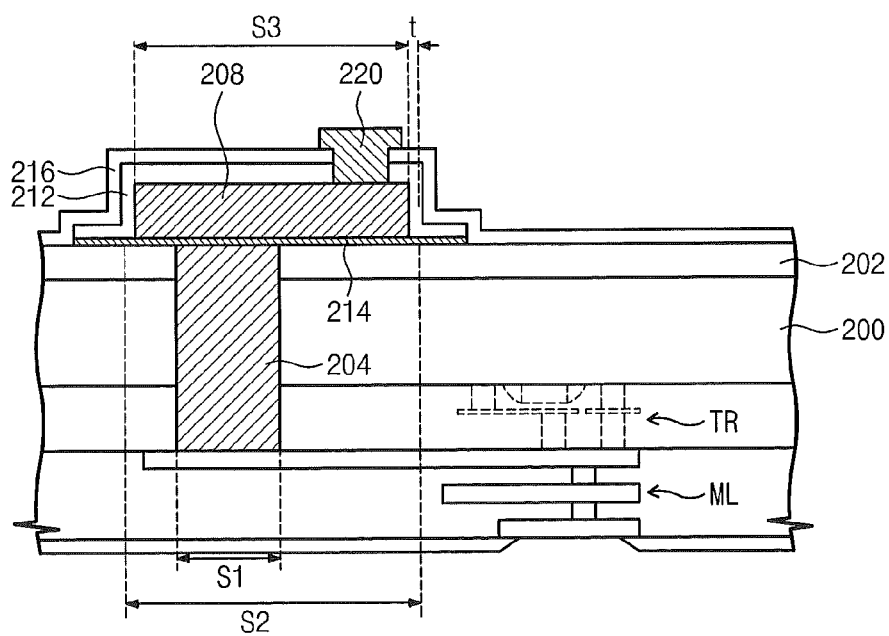

Referring to FIG. 2C, the insulating pattern 212 may be interposed between the second conductive pattern 208 and the passivation layer 216. The insulating pattern 212 of FIG. 2C may be configured to have substantially the same technical feature as the insulating pattern 212 of FIG. 2A, except for uniformity in thickness of the insulating pattern 212 of FIG. 2C. Furthermore, a portion of the insulating pattern 212 disposed on the sidewall of the second conductive pattern 208 may have an 'L'-shaped section.

Figure 2D:
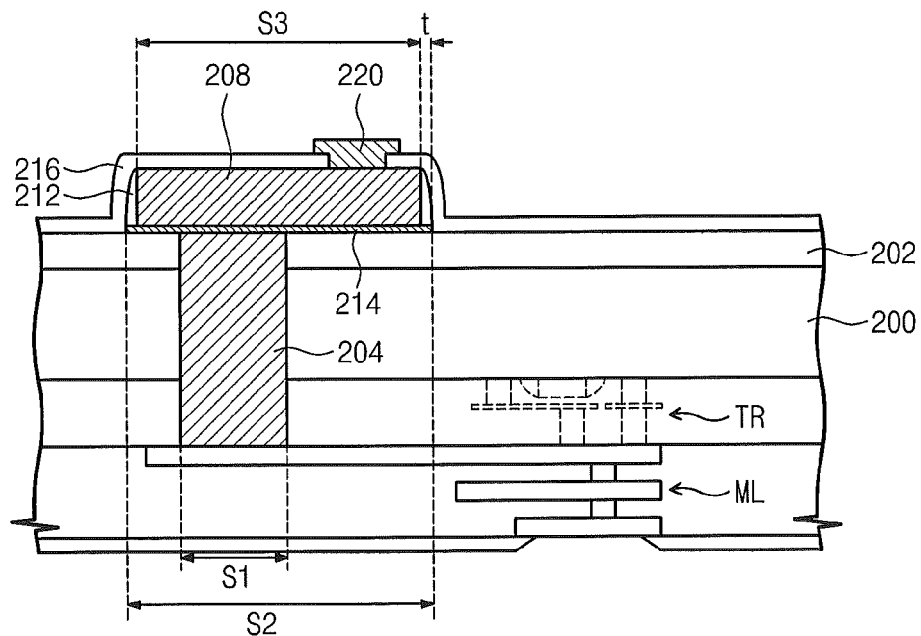

Referring to FIG. 2D, the insulating pattern 212 may be provided on both sidewalls of the second conductive pattern 208 to have a spacer-like shape. For example, the insulating pattern 212 may be formed to have a width increasing toward the barrier pattern 214. In example embodiments, both sidewalls of the second conductive pattern 208 may be fully covered with the insulating pattern 212.

According to the example embodiments described with reference to FIGS. 2A through 2D, the insulating pattern 212 may be provided to fully cover a top surface of the barrier pattern 214 exposed by the second conductive pattern 208, similar to the embodiments described with reference to FIG. 1B. For example, a sidewall of the barrier pattern 214 may be aligned with an outer sidewall of the insulating pattern 212, in plan view.

In example embodiments, such as the example embodiments described with reference to FIG. 1C, the insulating pattern 212 of FIGS. 2A through 2D may be formed to have a portion laterally protruding past the barrier pattern 214 to cantilever over the insulating layer 104. For example, the outermost sidewall of the insulating pattern 212 may be located outside a sidewall of the barrier pattern 214 relative to the side wall of the second conductive pattern 208. In example embodiments, in sectional view, the second width S2 of the barrier pattern 214 may range from the third width S3 of the second conductive pattern 208 to the sum of widths of the second conductive pattern 208 and a pair of the insulating patterns 212 (i.e., S3+2t).

FIGS. 3A through 3J are sectional views illustrating methods of manufacturing a semiconductor device according to example embodiments of inventive concepts.

Figure 3A:
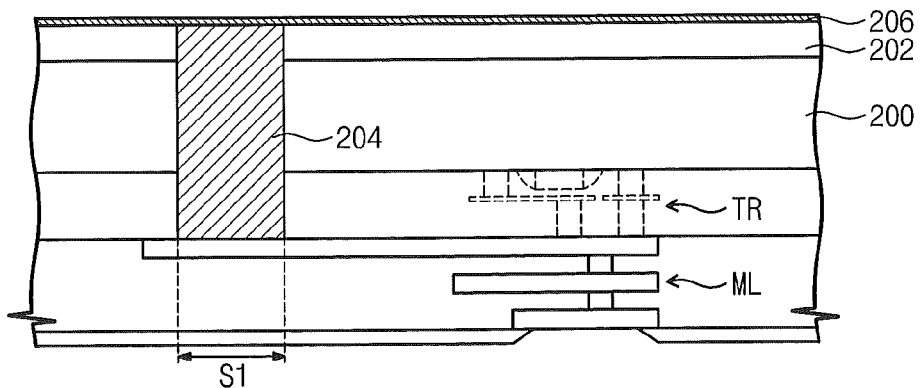
FIGS. 3A through 3J are sectional views illustrating methods of manufacturing a semiconductor device according to example embodiments of inventive concepts.

Referring to FIG. 3A, a first conductive pattern 204 and a barrier layer 206 may be provided in/on a semiconductor substrate 200.

For example, the first conductive pattern 204 may be formed through the semiconductor substrate 200. In example embodiments, the first conductive pattern 204 may serve as a through-silicon via. Furthermore, several electric or electronic components, such as a transistor TR and a metal interconnection line ML, may be integrated on a back surface of the semiconductor substrate 200.

The semiconductor substrate 200 may be etched to expose the first conductive pattern 204. In example embodiments, the first conductive pattern 204 may be formed to have a first width S1 in plan or vertical sectional view.

In example embodiments, a first insulating layer 202 may be formed on a surface of the semiconductor substrate 200, which is opposite to the surface provided with the electric or electronic components. In this example, the first conductive pattern 204 may be formed to penetrate both the semiconductor substrate 200 and the first insulating layer 202.

Thereafter, a barrier layer 206 may be formed on the semiconductor substrate 200 (e.g., on the first insulating layer 202) to cover the exposed surface of the first conductive pattern 204. The barrier layer 206 may include at least one of tantalum, tantalum nitride, titanium, titanium nitride, copper, nickel, silver, or any mixture or alloy thereof. The barrier layer 206 may be formed using a sputtering or physical vapor deposition process. In example embodiments, the barrier layer 206 may serve as a seed layer for forming a second conductive pattern 208, which will be described with reference, for example, to FIG. 3B.

Figure 3B:
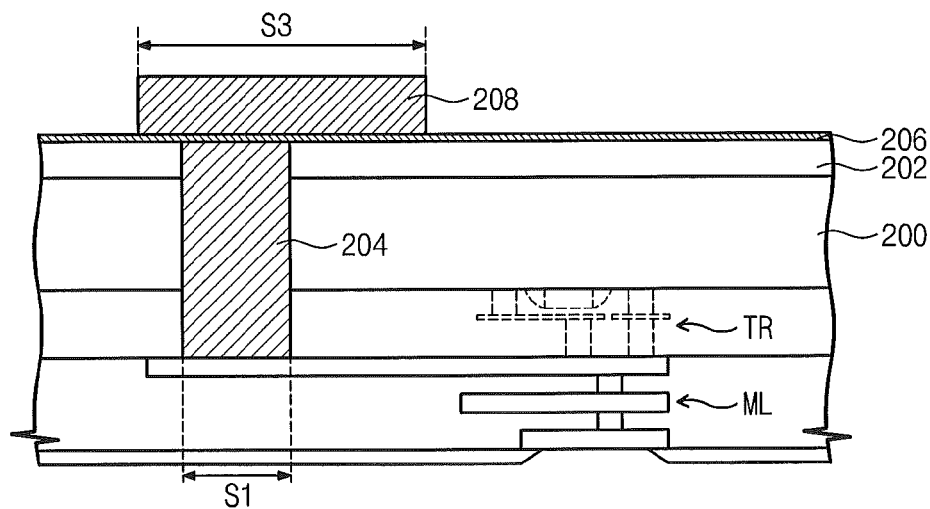

Referring to FIG. 3B, a second conductive pattern 208 may be formed on the barrier layer 206. In example embodiments, a portion of the second conductive pattern 208, which is in contact with the barrier pattern 206, may have a third width S3.

For example, the formation of the second conductive pattern 208 may include forming a conductive layer on the barrier layer 206, which is used as a seed layer. In example embodiments, the conductive layer may be formed using an electro-plating technique. Thereafter, the conductive layer may be patterned to form the second conductive pattern 208 electrically connected to the first conductive pattern 204. The barrier layer 206 may be interposed between the first conductive pattern 204 and second conductive pattern 208.

An alignment process may be further performed to align the second conductive pattern 208 with the first conductive pattern 204, after or before the formation of the second conductive pattern 208.

In example embodiments, the second conductive pattern 208 may serve as a redistributed interconnection line.

Figure 3C:
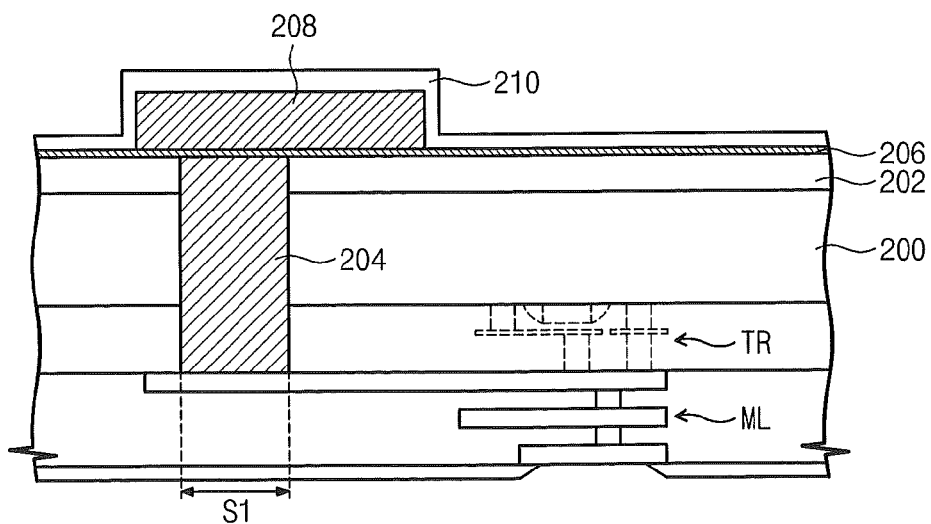

Referring to FIG. 3C, a second insulating layer 210 may be conformally formed on the barrier layer 206 and the second conductive pattern 208.

The second insulating layer 210 may include a material having an etch selectivity with respect to the barrier layer 206 and the second conductive pattern 208. For example, the barrier layer 206 and the second conductive pattern 208 may include a metallic material, and the second insulating layer 210 may include at least one insulating layer (e.g., of oxide, nitride, or oxynitride).

In example embodiments, the second insulating layer 210 may be formed using a chemical vapor deposition (CVD) process. As the result of the use of the CVD process, a thickness of the second insulating layer 210 may be greater on a top surface of the second conductive pattern 208 than on both sidewalls of the second conductive pattern 208 and on the barrier layer 206. This thickness ratio may be 1:1.2. Other ratios may be provided.

Figure 3D:
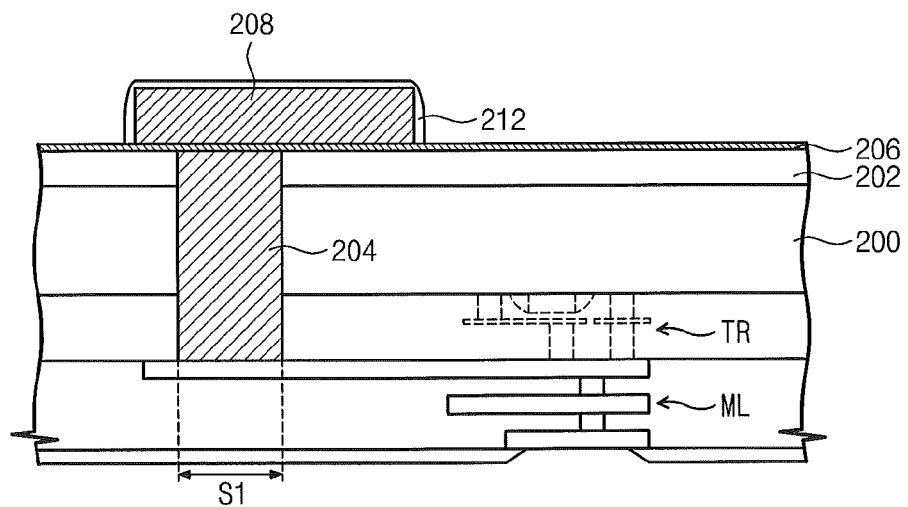

Referring to FIG. 3D, the second insulating layer 210 may be etched to form an insulating pattern 212 disposed at least on both sidewalls of the second conductive pattern 208.

In example embodiments, the second insulating layer 210 may be etched using a dry etching process without any mask (i.e., in a blank etch-back manner) to form the insulating pattern 212. As the result of the blank etch-back, a portion of the second insulating layer 210 may remain on the sidewalls of the second conductive pattern 208. Furthermore, in the case in which the second insulating layer 210 is thicker on the top surface of the second conductive pattern 208 than on the barrier layer 206, a portion of the second insulating layer 210 may remain on the top surface of the second conductive pattern 208 after the blank etch-back process. As a result, as shown in FIG. 3D, the insulating pattern 212 may cover both the top surface and the sidewalls of the second conductive pattern 208. In example embodiments, the portion of the insulating pattern 212 disposed on sidewalls of the second conductive pattern 208 may have a width increasing toward the barrier pattern 206.

In example embodiments, according to a process condition of the blank etch-back process, the second insulating layer 210 may be fully removed from the top surface of the second conductive pattern 208, as shown in FIG. 2D. Furthermore, on sidewalls of the second conductive pattern 208, a removal amount of the second insulating layer 210 may vary according to a process condition of the blank etch-back process.

Figure 3E:
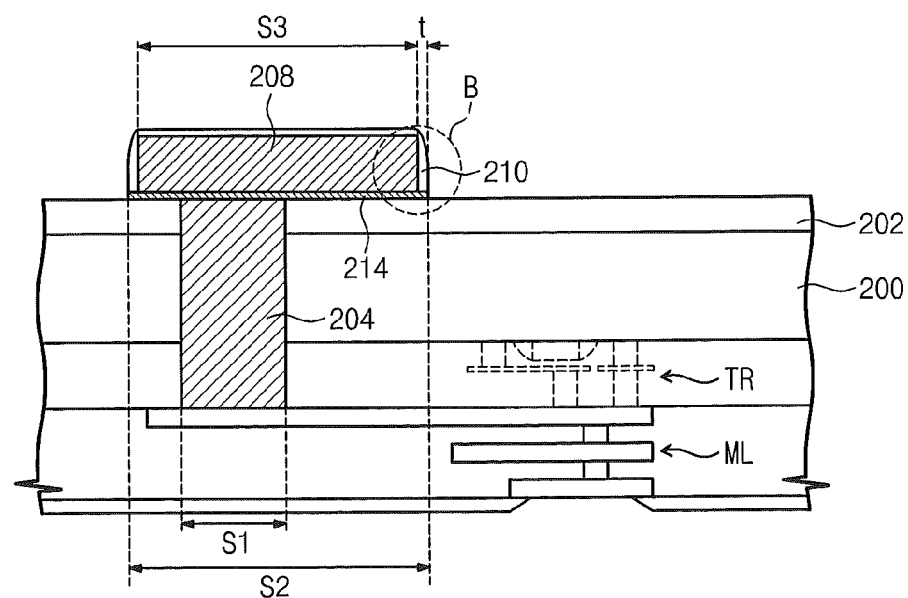

Referring to FIG. 3E, the barrier layer 206 may be etched using the insulating pattern 212 and the second conductive pattern 208 as an etch mask to form a barrier pattern 214.

Figure 3F:
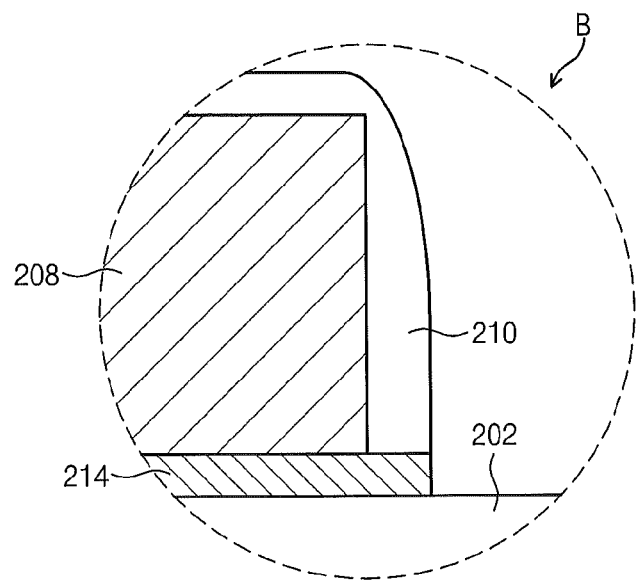
Figure 3G:
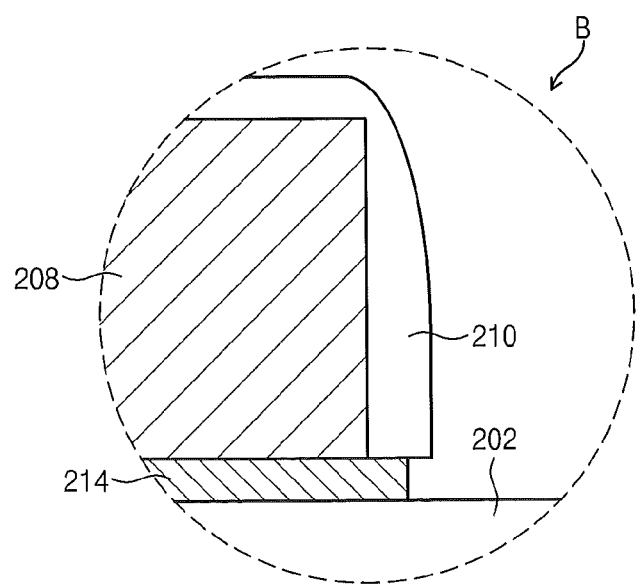

The etching of the barrier layer 206 may be performed using a dry and wet etching process. FIGS. 3F and 3G are enlarged sectional views illustrating a portion B of FIG. 3E. In more detail, FIG. 3F shows the resultant structure, in which the barrier layer 206 is etched using a dry etching process, and FIG. 3G shows the resultant structure, in which the barrier layer 206 is etched using a wet etching process.

In example embodiments of FIG. 3F, the barrier layer 206 may be etched by the dry etching process to form the barrier pattern 214 provided between the first conductive pattern 204 and the second conductive pattern 208. Owing to anisotropy of the dry etching process, a sidewall of the barrier pattern 214 may be aligned to an outermost sidewall of the insulating pattern 212 as shown in FIG. 3F.

Since the barrier pattern 214 is formed using the dry etching process after the formation of the insulating pattern 212, it is possible to prevent an under-cut region from being formed at both sides of the barrier pattern 214. In more detail, in some conventional approaches, the formation of the barrier pattern 214 includes isotropically etching the barrier layer 206, without the use of the insulating pattern 212, in a wet etching manner. In this case, it may be hard to control exactly an etching amount of the barrier layer 206, such that the barrier layer 206 may be over-etched in a lateral direction. As a result, the undercut or void region deteriorating electric reliability of the semiconductor device may be formed between the first insulating layer and the second conductive pattern 208. By contrast, according to example embodiments of inventive concepts, since the barrier layer 206 is anisotropically etched using a dry etching process after forming the insulating pattern 212, it is possible to control a lateral etching amount of the barrier layer 206 and to suppress the undercut or void region from being formed.

Furthermore, in some conventional approaches, there has been a limitation in reducing a width of the second conductive pattern 208, due to the undercut or void region. By contrast, the formation of the undercut or void region can be easily prevented by the manufacturing method according to the example embodiments of the inventive concept, and this enables to reduce the width of the second conductive pattern 208.

Referring back to FIG. 3E, the barrier pattern 214 may be formed to have a second width S2 substantially greater than the third width S3. In example embodiments, the second width S2 may be substantially equivalent to the sum of the width of the second conductive pattern 208 and a width of a pair of the insulating patterns 212 (i.e., S3+2t).

In example embodiments, in the case in which a portion of the insulating pattern 212 remains on the second conductive pattern 208, it is possible to protect the second conductive pattern 208 against the process of dry etching the barrier layer 206.

According to some aspects of the inventive concepts, the blank etch-back process of the second insulating layer 210 and the dry etching process of the barrier layer 206, described with reference to FIGS. 3D and 3E, respectively, may be performed, in an in-situ manner or in a single process chamber. Due to the use of the in-situ process, it is possible to prevent the semiconductor substrate 200 from being contaminated during transferring the semiconductor substrate 200 to other process chamber.

In example embodiments of FIG. 3G, the barrier layer 206 may be etched using a wet etching process to form the barrier pattern 214 between form the first conductive pattern 204 and second conductive pattern 208. Due to the use of the wet etching process, a sidewall of the barrier pattern 214 may be recessed inward from the outermost sidewall of the insulating pattern 212, such that the insulating pattern 212 may have a portion protruding outward from the barrier pattern 214 to cantilever over the insulating pattern 202. Accordingly, the barrier pattern 214 may be formed to have a second width S2 ranging from the third width S3 of the second conductive pattern 214 to the sum of widths of the second conductive pattern 214 and a pair of the insulating patterns 212 (i.e., S3+2t).

Figure 3H:
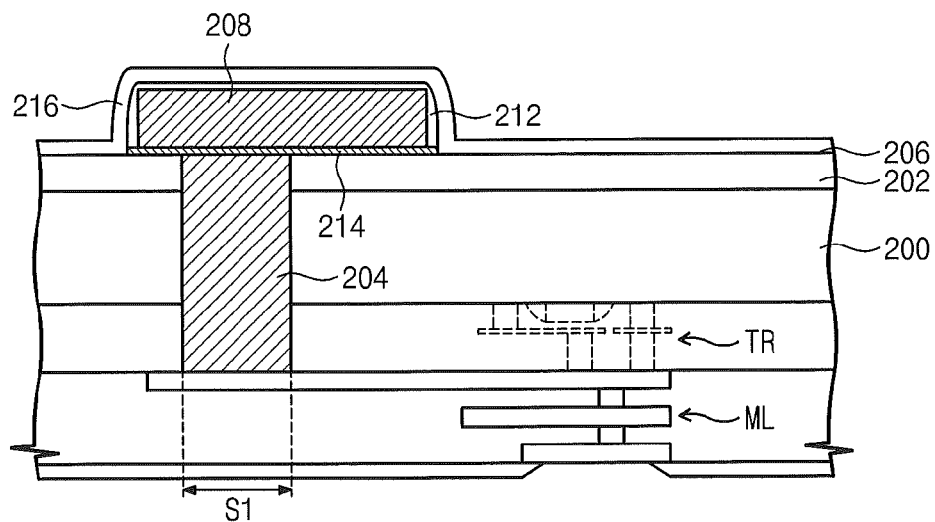

Referring to FIG. 3H, a passivation layer 216 may be conformally formed on the semiconductor substrate 200 provided with the insulating pattern 212, the second conductive pattern 208, and the barrier pattern 214.

The passivation layer 216 may include an insulating material, for example, polyimide. In example embodiments, the passivation layer 216 may be formed using a chemical vapor deposition process or an atomic layer deposition process.

Figure 3I:
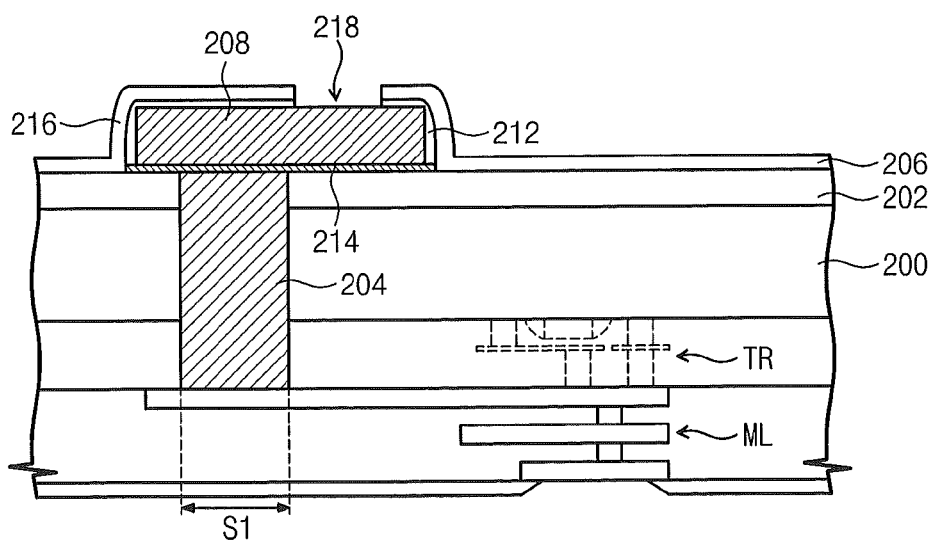

Referring to FIG. 3I, the passivation layer 216 and the insulating pattern 212 may be etched to form an opening 218 exposing partially a top surface of the second conductive pattern 208.

For example, the formation of the opening 218 may include forming a mask (not shown) on the passivation layer 216 and then etching the passivation layer 216 and the insulating pattern 212 using the mask as an etching mask to expose a portion of the second conductive pattern 208. The mask may be removed after the formation of the opening 218.

Figure 3J:
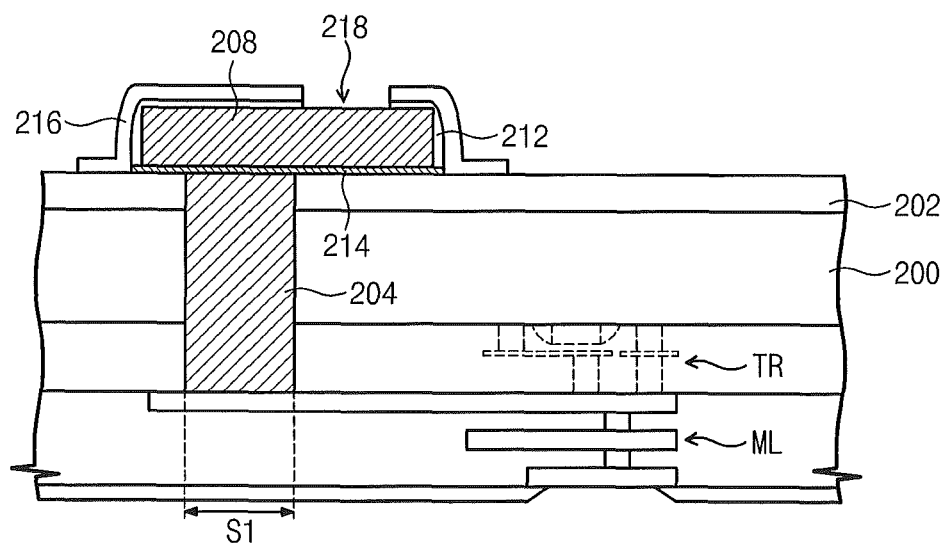

In example embodiments of FIG. 3J, a portion of the passivation layer 216 provided on the insulating layer 202 may be etched during forming the opening 218 in the passivation layer 216.

Referring back to FIG. 2A, the opening 218 may be filled with a third conductive pattern 220 electrically connected to the second conductive pattern 208. In example embodiments, the third conductive pattern 220 may be used as a pad or a redistribution pattern connected to an external device or semiconductor chip.

Figure 4A:
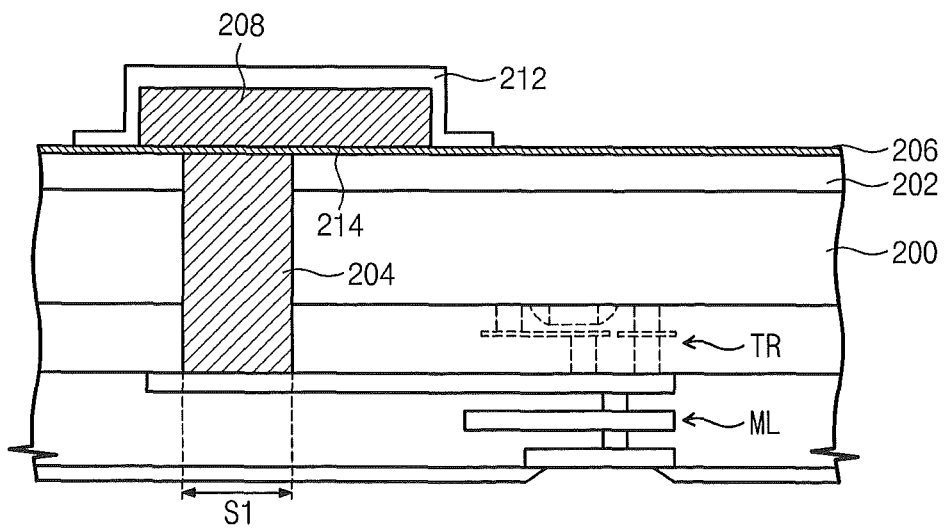
FIGS. 4A and 4B are sectional views illustrating methods of manufacturing a semiconductor device according to other example embodiments of inventive concepts.
Figure 4B:
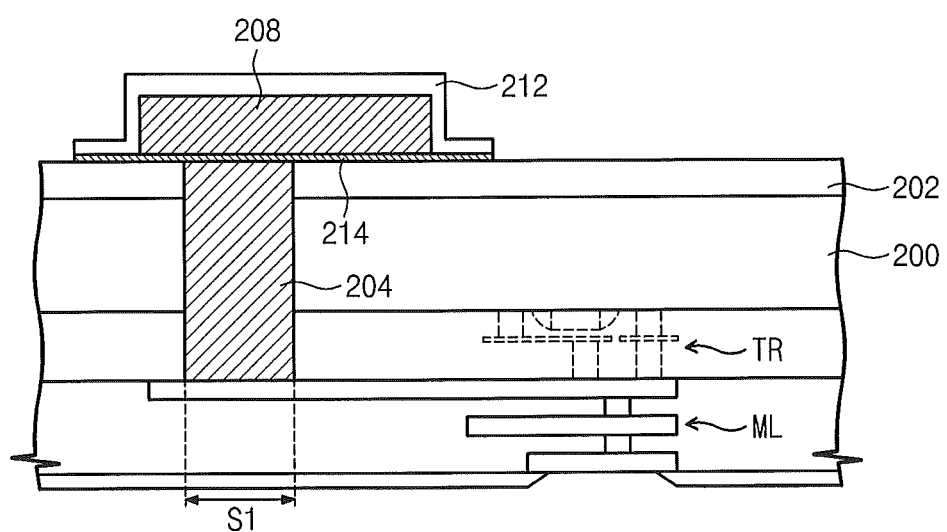

FIGS. 4A and 4B are sectional views illustrating methods of manufacturing a semiconductor device according to other example embodiments of inventive concepts.

Referring to FIG. 4A, a barrier layer 206, a second conductive pattern 208, and an insulating pattern 212 may be formed on a semiconductor substrate 200 provided with a first conductive pattern 204.

For example, the first conductive pattern 204 may be formed through the semiconductor substrate 200, and then, the barrier layer 206 and the second conductive pattern 208 may be formed on the semiconductor substrate 200. Thereafter, a second insulating layer 210 may be conformally formed on the second conductive pattern 208 and the barrier layer 206. These steps can be performed using those previously described with reference to FIGS. 3A through 3D and thus will not be described in much further detail, for the sake of brevity.

The second insulating layer 210 may be etched to form the insulating pattern 212 covering fully the second conductive pattern 208 and extending laterally onto the barrier layer 206. In example embodiments, the formation of the insulating pattern 212 may include forming a mask (not shown) on the second insulating layer 210 and then etching the second insulating layer 210 using the mask as an etching mask.

Referring to FIG. 4B, the barrier layer 206 may be etched using the insulating pattern 212 and the second conductive pattern 208 as an etch mask to form a barrier pattern 214.

In example embodiments, the etching of the barrier layer 206 may be performed using a dry etching process. This step can be performed using those previously described with reference to FIGS. 3F and 3G.

In example embodiments, the etching of the barrier layer 206 may be performed using a wet etching process. This step can be performed using those previously described with reference to FIGS. 3F and 3H.

Since the barrier pattern 214 is formed after the formation of the insulating pattern 212, it is possible to prevent an under-cut region from being formed at both sides of the barrier pattern 214 and to prevent a void region between the semiconductor substrate 200 and the second conductive pattern 208. This enables to improve electric reliability of the semiconductor device.

Referring back to FIG. 2B, a passivation layer 216 may be formed on the semiconductor substrate 200 provided with the insulating pattern 212, the second conductive pattern 208, and the barrier pattern 214 to expose partially a top surface of the second conductive pattern 208, and next, a third conductive pattern 220 may be electrically connected to the second conductive pattern 208. These steps can be performed using those previously described with reference to FIGS. 3H, 3I, and 2A.

Figure 5A:
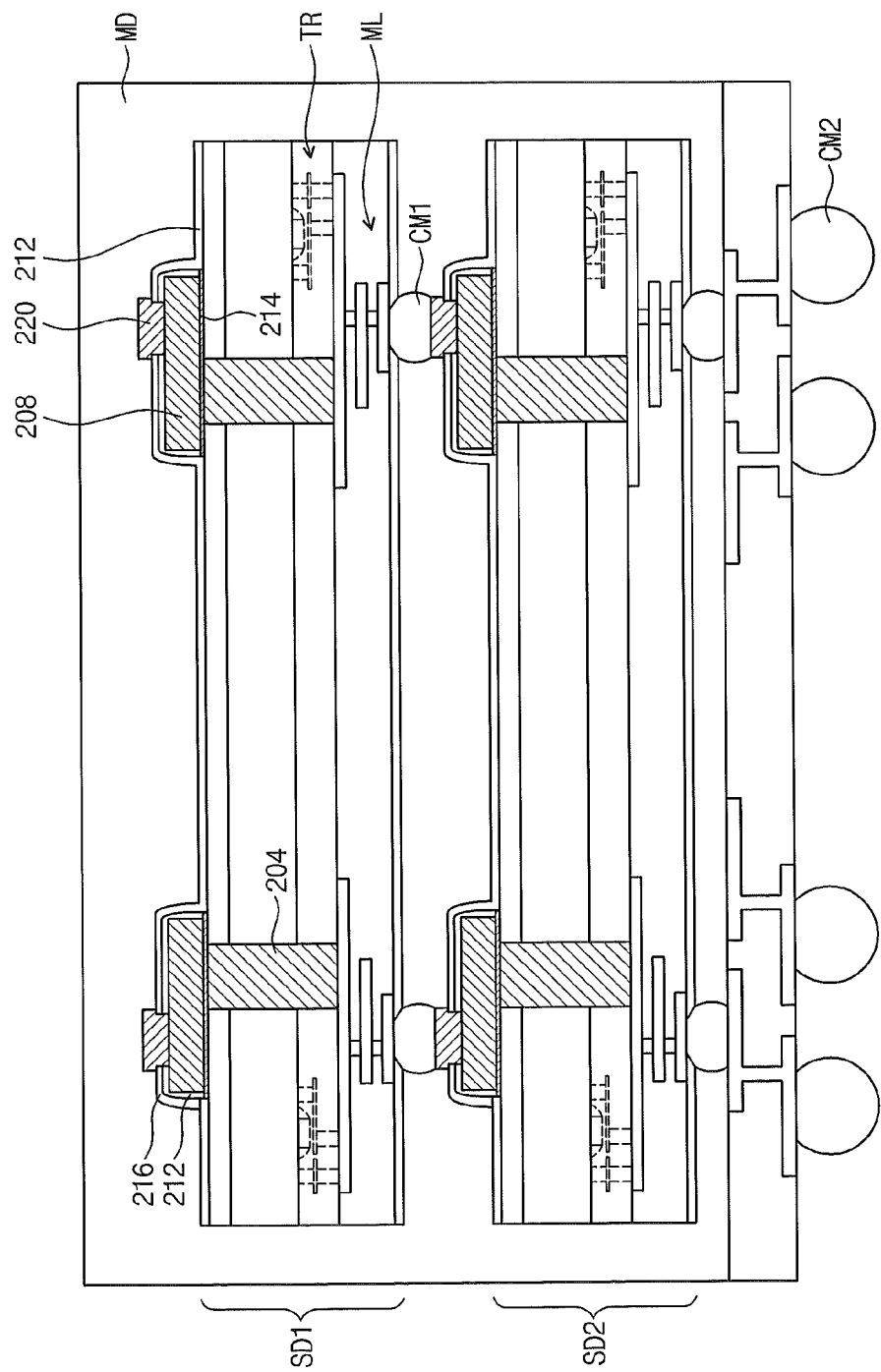
FIG. 5A is a sectional view of a semiconductor package including the semiconductor devices according to example embodiments of inventive concepts.

FIG. 5A is a sectional view of a semiconductor package including the semiconductor devices according to example embodiments of inventive concepts.

Referring to FIG. 5A, a semiconductor package may include a plurality of vertically stacked semiconductor devices SD1 and SD2, a first connecting element CM1 interposed between the semiconductor devices SD1 and SD2 to connect them to each other electrically, a second connecting element CM2 electrically connecting the semiconductor devices SD1 and SD2 to an external device, and a molding element MD protecting the semiconductor devices SD1 and SD2 against external environment. In example embodiments, the semiconductor devices SD1 and SD2 of FIG. 5A may be configured to have the substantially same technical features as those described with reference to FIGS. 2A and 2B.

Figure 5B:
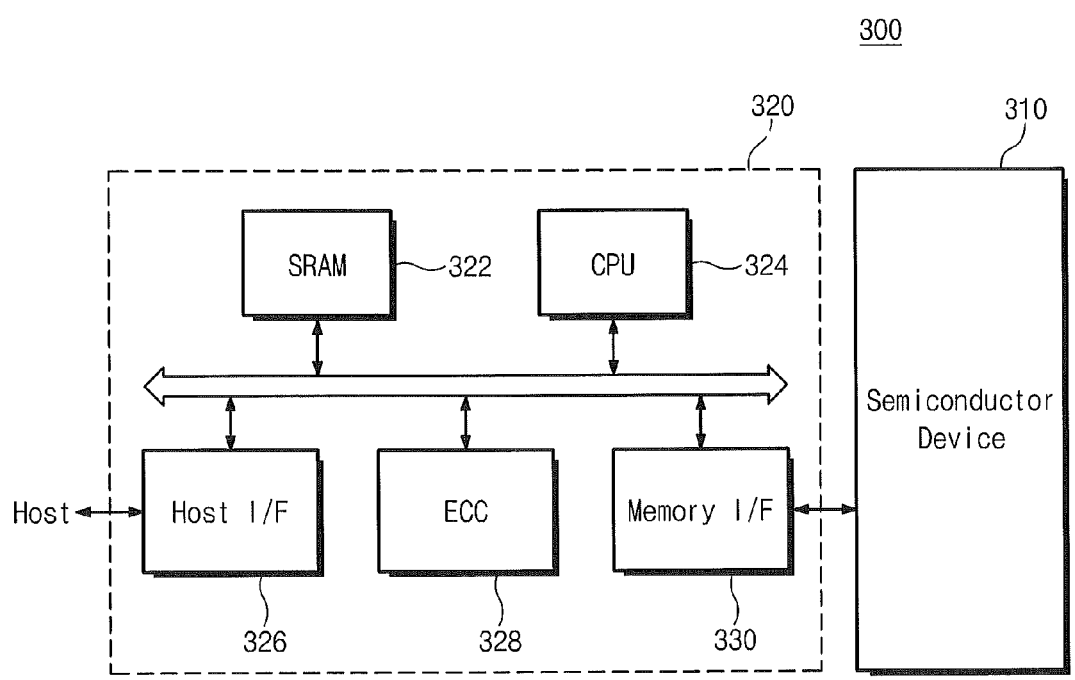
FIG. 5B is a block diagram illustrating a memory card including a semiconductor device according to the exemplary embodiments of the inventive concept.

FIG. 5B is a block diagram illustrating a memory card including a semiconductor device according to the exemplary embodiments of the inventive concept.

Referring to FIG. 5B, a semiconductor device according to exemplary embodiments of the inventive concept may be applied to form a memory card 300. The memory card 300 may include a memory controller 320 to control a data exchange between a host and a semiconductor memory device 310. A static random access memory 322 may be used as an operation memory of a central processing unit 324. A host interface 326 may include at least one data exchange protocol of the host connected to the memory card 300. An error correction code circuit 328 may detect and correct at least one error that may be included in data read from the semiconductor memory device 310. A memory interface 330 can interface with the semiconductor memory device 310. The central processing unit 324 can control data exchange of the memory controller 320 with, for example, the semiconductor memory device 310.

The semiconductor memory device 310 in the memory card 300 may include the semiconductor device according to the exemplary embodiments of the inventive concept. As a result, the semiconductor memory device 310 can be configured to be able to prevent an undercut region from being formed in a barrier pattern interposed between two adjacent conductive patterns. Therefore, it is possible to improve electric reliability of the memory card 300.

Figure 5C:
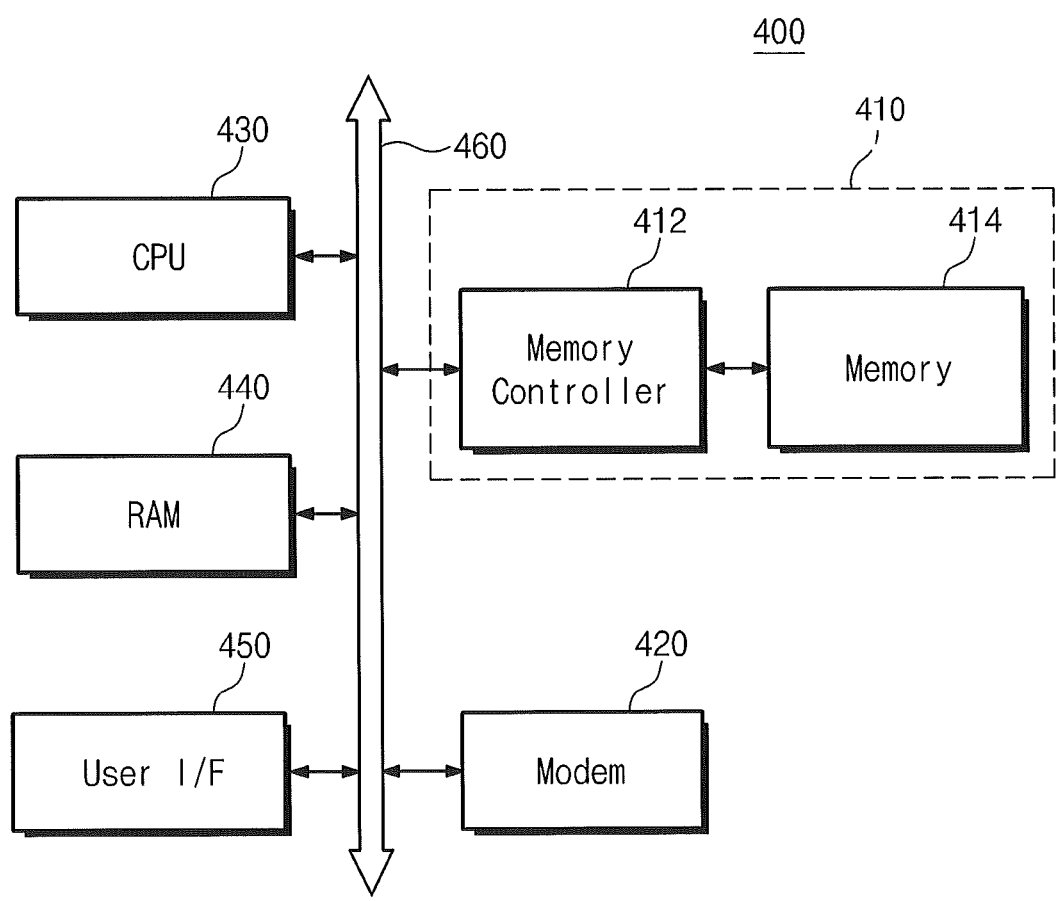
FIG. 5C is a block diagram illustrating an information processing system including a semiconductor device according to exemplary embodiments of the inventive concept.

FIG. 5C is a block diagram illustrating an information processing system including a semiconductor memory device according to exemplary embodiments of the inventive concept.

Referring to FIG. 5C, an information processing system 400 may include a semiconductor memory device according to exemplary embodiments of the inventive concept. The information processing system 400 may include a mobile device or a computer. As an illustration, the information processing system 400 may include the memory system 410, a modem 420, a central processing unit (CPU) 430, a random access memory (RAM) 440, and a user interface 450 that are electrically connected to a system bus 460. The memory system 410 may store data processed by the central processing unit (CPU) 430 and data input from the outside (e.g., via the user interface 450 and/or the modem 420). The memory system 410 may include a semiconductor memory device 414 and a memory controller 412. The memory system 410 may be the same as the memory card 300 described with reference to FIG. 5B. The information processing system 400 may be provided as a memory card, a solid state disk, a camera image sensor or an application chip set. For example, the memory system 410 may be a solid state disk (SSD). The information processing system 400 may stably and reliably store data in the memory system 410.

According to example embodiments of inventive concepts, the semiconductor device may include an insulating pattern configured to cover at least a portion of a sidewall of a conductive pattern, and thus, a barrier pattern disposed below the conductive pattern can be prevented from being laterally recessed. As a result, an undercut or void region can be suppressed from being formed at both sides of the barrier pattern. This enables to reduce a width of the conductive pattern and to improve electrical reliability of the semiconductor device.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a semiconductor substrate;
a first conductive pattern provided in the semiconductor substrate to have a first width at a surface level of the semiconductor substrate;
a barrier pattern covering the first conductive pattern and having a second width substantially greater than the first width;
a second conductive pattern partially covering the barrier pattern and having a third width substantially smaller than the second width; and
an insulating pattern disposed on a sidewall of the second conductive pattern, wherein the insulating pattern has a width increasing toward the barrier pattern,
wherein the second width is substantially equal to or less than a sum of the third width and a width of the insulating pattern.

2. The device of claim 1, wherein the insulating pattern is in contact with the barrier pattern and cover at least partially the sidewall of the second conductive pattern.

3. The device of claim 1, wherein the insulating pattern extends from the sidewall of the second conductive pattern to cover at least partially a top surface of the second conductive pattern.

4. The device of claim 3, wherein a portion of the insulating pattern disposed on the sidewall of the second conductive pattern has a width increasing toward the barrier pattern.

5. The device of claim 4, wherein a portion of the insulating pattern disposed on the sidewall of the second conductive pattern has a width that is substantially equal to as a portion of the insulating pattern disposed on the top surface of the second conductive pattern.

6. The device of claim 1, wherein the insulating pattern has a portion protruding outward from an outer sidewall of the barrier pattern.

7. The device of claim 1, further comprising:
a passivation layer disposed on the second conductive pattern, the insulating pattern, and the semiconductor substrate to expose partially the second conductive pattern; and
a third conductive pattern electrically connected to the second conductive pattern.

8. A semiconductor device comprising:
a first conductive pattern on a substrate;
a barrier pattern, between the first conductive pattern and the substrate, extending beyond opposing side walls of the first conductive pattern to provide extended barrier pattern portions;
a spacer on the opposing side walls of the first conductive pattern and covering at least top surfaces of the extended barrier pattern portions; and
a second conductive pattern, beneath the barrier pattern, entirely covered by the barrier pattern so that opposing side walls of the second conductive pattern are recessed relative to opposing side walls of the barrier pattern, wherein the spacer extends beyond the top surfaces of the opposing side walls of the barrier patterns to cantilever over the substrate to define undercut regions of the barrier patterns where the opposing side walls of the barrier pattern is recessed from the spacer.

9. The device of claim 8 wherein the spacer is aligned to the opposing side walls of the barrier pattern.

10. The device of claim 8 wherein the spacer extends across a top surface of the first conductive pattern between the opposing side walls of the first conductive pattern to provide a spacer upper surface including a recess therein, the device further comprising:
a third conductive pattern in the recess contacting the second conductive pattern, wherein opposing side walls of the third conductive pattern are recessed relative to the opposing side walls of the first conductive pattern.

11. The device of claim 10 further comprising:
a passivation layer on the second conductive pattern covering the spacer upper surface and extending onto a surface of the substrate.

12. The device of claim 8 wherein the second conductive pattern comprises a through-silicon-via contacting the barrier pattern on a first surface of the substrate and extending through the substrate away from the barrier pattern to penetrate a second surface of the substrate opposite the first surface.

13. A semiconductor device comprising:
a first conductive pattern on a substrate;

a barrier pattern, between the first conductive pattern and the substrate, extending beyond opposing side walls of the first conductive pattern to provide extended barrier pattern portions;

a spacer on the opposing side walls of the first conductive pattern and covers at least top surfaces of the extended barrier pattern portions;

a second conductive pattern, beneath the barrier pattern, entirely covered by the barrier pattern so that opposing side walls of the second conductive pattern are recessed relative to opposing side walls of the barrier pattern; and an insulating pattern disposed on a sidewall of the second conductive pattern and extending therefrom to cover, at least partially, a top surface of the second conductive pattern.

14. The device of claim 13 wherein the spacer extends beyond the top surfaces of the opposing side walls of the barrier patterns to cantilever over the substrate to define undercut regions of the barrier patterns where the opposing side walls of the barrier patterns are recessed from the spacer.

15. The device of claim 13 wherein the spacer is aligned to the opposing side walls of the barrier pattern.

16. The device of claim 13 wherein the spacer extends across a top surface of the first conductive pattern between the opposing side walls of the first conductive pattern to provide a spacer upper surface including a recess therein, the device further comprising:

a third conductive pattern in the recess contacting the second conductive pattern, wherein opposing side walls of the third conductive pattern are recessed relative to the opposing side walls of the first conductive pattern.

17. The device of claim 16 further comprising:

a passivation layer on the second conductive pattern covering the spacer upper surface and extending onto a surface of the substrate.

18. The device of claim 13 wherein the second conductive pattern comprises a through-silicon-via contacting the barrier pattern on a first surface of the substrate and extending through the substrate away from the barrier pattern to penetrate a second surface of the substrate opposite the first surface.

* * * * *